United States Patent
Barrett

(10) Patent No.: US 9,007,240 B2
(45) Date of Patent: *Apr. 14, 2015

(54) DISPARITY REDUCTION FOR HIGH SPEED SERIAL LINKS

(71) Applicant: International Business Machines Corporation, Armonk, NY (US)

(72) Inventor: Wayne M. Barrett, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 124 days.

This patent is subject to a terminal disclaimer.

(21) Appl. No.: 13/769,422

(22) Filed: Feb. 18, 2013

(65) Prior Publication Data

US 2014/0064357 A1 Mar. 6, 2014

Related U.S. Application Data

(63) Continuation of application No. 13/599,196, filed on Aug. 30, 2012, now Pat. No. 8,823,558.

(51) Int. Cl.
*H03M 13/00* (2006.01)
*H04L 12/933* (2013.01)
*H03M 13/31* (2006.01)

(52) U.S. Cl.
CPC ........... *H03M 13/00* (2013.01); *H04L 49/1507* (2013.01); *H03M 13/31* (2013.01)

(58) Field of Classification Search
CPC ..... H03M 5/145; H03M 1/0665; H03M 7/14; H03M 7/12; H03M 13/00; H03M 13/31
USPC .................................... 341/51, 52, 58, 59, 61
See application file for complete search history.

(56) References Cited

U.S. PATENT DOCUMENTS

| | | | |
|---|---|---|---|
| 5,636,279 A * | 6/1997 | Katta et al. ..................... 380/217 |
| 6,188,337 B1 * | 2/2001 | Soljanin .......................... 341/59 |
| 6,271,775 B1 * | 8/2001 | Jaquette et al. .................. 341/87 |
| 6,488,337 B1 | 12/2002 | De Voss et al. |
| 6,628,725 B1 | 9/2003 | Adam et al. |
| 6,738,935 B1 | 5/2004 | Kimmitt |
| 7,218,254 B2 | 5/2007 | Kahlman |
| 7,529,933 B2 * | 5/2009 | Palekar et al. ................ 713/168 |
| 7,592,993 B2 | 9/2009 | Kim |
| 7,984,369 B2 | 7/2011 | Sul et al. |
| 8,185,718 B2 | 5/2012 | Chen et al. |
| 2003/0227398 A1 | 12/2003 | Chen et al. |
| 2004/0150458 A1 * | 8/2004 | Gupta et al. ................... 327/407 |

(Continued)

OTHER PUBLICATIONS

U.S. Appl. No. 13/599,196, entitled Disparity Reduction for High Speed Serial Links, filed Aug. 30, 2012.

*Primary Examiner* — Linh Nguyen
(74) *Attorney, Agent, or Firm* — Patterson & Sheridan, LLP

(57) ABSTRACT

System, computer program product, and computer-implemented method to improve a running disparity of an encoded bit stream in a distributed network switch, the distributed network switch comprising a plurality of switch modules including a first switch module, by receiving, at the first switch module, a raw data stream comprising a plurality of bits, receiving a bit sequence, encoding at least a first bit of the raw data stream using a corresponding at least a first bit of the bit sequence, transmitting the encoded first bit, inverting the first bit of the bit sequence, and encoding a second bit of the raw data stream using the inverted first bit.

7 Claims, 5 Drawing Sheets

(56) References Cited

U.S. PATENT DOCUMENTS

| | | | |
|---|---|---|---|
| 2004/0239536 A1* | 12/2004 | Kahlman | 341/59 |
| 2005/0219074 A1 | 10/2005 | Kahlman | |
| 2007/0036173 A1 | 2/2007 | McCrosky et al. | |
| 2007/0063880 A1* | 3/2007 | Goller et al. | 341/100 |
| 2009/0201746 A1 | 8/2009 | Morzano et al. | |
| 2010/0122143 A1* | 5/2010 | Lee et al. | 714/752 |
| 2010/0123609 A1 | 5/2010 | Yu et al. | |
| 2011/0279292 A1* | 11/2011 | Parida et al. | 341/62 |
| 2014/0064356 A1 | 3/2014 | Barrett | |

* cited by examiner

Standard Pseudo Random Binary Sequence (PRBS) Pattern

Modified PRBS Patteren when using the Disparity Reduction Method

Running Disparity with the Modified PRBS Pattern while transmitting IDLEs or constant/fixed data

DISPARITY REDUCTION FOR HIGH SPEED SERIAL LINKS

CROSS-REFERENCE TO RELATED APPLICATIONS

This application is a continuation of co-pending U.S. patent application Ser. No. 13/599,196, filed Aug. 30, 2012. The aforementioned related patent application is herein incorporated by reference in its entirety.

BACKGROUND

Embodiments disclosed herein relate to encoding raw data in a data stream. More specifically, embodiments disclosed herein relate to techniques to reduce disparity of encoded data in high speed serial links.

Computer fabric interconnections often involve a collection of high-speed serial links. Raw (or uncoded) data is not transmitted on these links because the characteristics of a raw data serial bit stream are not conducive to the electronics involved. Important characteristics of an optimal serial bit stream include: (i) an adequate transition density, (ii) good direct current (DC) balance, and (iii) randomness of the data. Raw data typically goes through a "data coding" stage prior to transmission, thereby modifying it in a predictable fashion in order to achieve these desired characteristics.

Modern solutions to reduce the risk of baseline wander (also known as DC imbalance) were moderately successful, but did not eliminate large swings in running disparity (i.e., baseline wander calculated over a period of time). Disparity is a term used to identify the numeric difference between the number of zeroes and ones in a bit stream. Different primitive polynomials may be used to encode raw data, but each may produce different baseline wander, especially when the raw data is comprised of constant data values. PCIe 3.0 attempted to fix this problem by choosing a primitive polynomial that did not include peaks or valleys in the baseline wander graph. This solution reduced the risk of baseline wander moderately, but did not totally eliminate the large swings in the running disparity. The 64B/67B encoding method (called the Interlaken Protocol) solved this problem by adding an additional bit transmitted with each word to indicate whether that word was inverted prior to transmission. However, while this solution effectively reduces baseline wander, it does so at the expense of bandwidth, as an extra bit must be transmitted with each word.

SUMMARY

Embodiments disclosed herein provide a system, computer program product, and computer-implemented method to improve a running disparity of an encoded bit stream in a distributed network switch, the distributed network switch comprising a plurality of switch modules including a first switch module, by receiving, at the first switch module, a raw data stream comprising a plurality of bits, receiving a bit sequence, encoding a first bit of the raw data stream using a bit of the bit sequence, inverting the first bit of the bit sequence, and encoding a second bit of the raw data stream using the inverted first bit.

BRIEF DESCRIPTION OF THE SEVERAL VIEWS OF THE DRAWINGS

So that the manner in which the above recited aspects are attained and can be understood in detail, a more particular description of embodiments of the disclosure, briefly summarized above, may be had by reference to the appended drawings.

It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
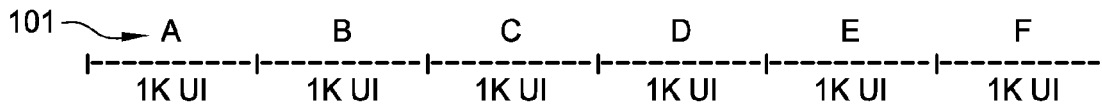
FIGS. 1A-1C are schematics illustrating techniques to reduce disparity in high speed serial links, according to one embodiment disclosed herein.

Embodiments provide a system, computer program product, and computer-implemented method to improve a running disparity of an encoded bit stream in a distributed network switch. The distributed network switch may include a plurality of switch modules. Embodiments may receive, at a first one of the switch modules, a raw data stream comprising a plurality of bits. Additionally, embodiments may receive a bit sequence. Embodiments may encode a first bit of the raw data stream using a corresponding first bit of the bit sequence. Embodiments may also invert the first bit of the bit sequence and use the inverted first bit to encode a second bit of the raw data stream.

Embodiments disclosed herein relate to the problem of direct current (DC) imbalance (also called baseline wander or running disparity) when scrambling raw data with a high-order polynomial. The techniques described herein not only reduce running disparity, but also eliminate the need to transmit an extra bit with each word. Disparity is a term used to identify the numeric difference between the number of ones and zeroes in an encoded bit stream. Baseline wander is caused by an accumulated excess of zeroes or ones in the bit stream, or, in other words, a high disparity between zeroes and ones over time. Even though a serial link may be AC-coupled, a temporary imbalance in either direction can produce a movement in the center voltage of the eye opening, potentially increasing the bit error rate. Disparity can be calculated over a fixed time period, or can reflect a continuous value (i.e., running disparity). Different primitive polynomials produce different baseline wander profiles. The greatest risk for problems with baseline wander is during the times when the raw data is comprised of IDLE's (or any other constant data value) transmitted to maintain an active data connection, because XORing a constant value (such as all zeroes or all ones) with a variable always produces the same result, namely, the variable itself.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1A is a schematic illustrating a technique 101 for encoding a raw data stream. The technique 101 is a coding mechanism which uses a maximal-length linear feedback shift register (LFSR) to generate a pseudo random binary sequence (PRBS) using a selected bit from the LFSR. An exclusive or (XOR) operation is then performed between the PRBS and the raw data to generate an encoded data stream. As shown, a plurality of exemplary PRBS segments A-F, labeled 111-116, have been generated by the LFSR. The segments 111-116 are divided into a predefined segment length of 1,000 bits or unit intervals (1K UI). These PRBS segments (111-116) are used in sequence to encode the raw data stream. For example, once the PRBS of the segment A are used to XOR a corresponding segment of raw data, the new segment B is generated and used to XOR a subsequent corresponding raw data segment.

Figure 1B:
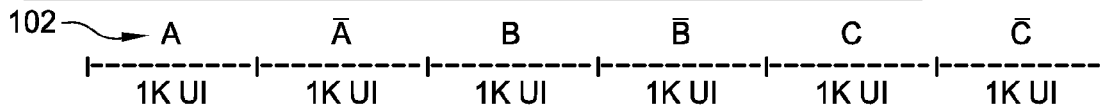

FIG. 1B is a schematic 102 illustrating techniques to encode a raw data stream to reduce disparity in high speed serial links, according to one embodiment disclosed herein. As shown, six PRBS segments 121-126 are provided, each comprising a 1K unit interval. The raw data stream may comprise functional system data, IDLE line detect data, or fixed/constant data. However, rather than using the PRBS pattern shown in FIG. 1A for scrambling the data, each 1K UI segment is repeated, with the second usage being an inverted version of the first usage. Inverting a binary bit comprises altering the value from one state to another (for example, from "0" to "1", or vice versa). An LFSR provides the PRBS. The LFSR may be of any size, but in one embodiment, the LFSR is 40 bits long, and a predefined bit position is used to select a bit from each cycle of the LFSR to send as the next bit in the PRBS. In one embodiment, the least significant bit of the LFSR is predefined as the bit position which is sent as the bit in the PRBS. The selection of the least significant bit is merely illustrative, as any bit position may be selected, so long as the same bit position is selected each time. The contents of the LFSR could be saved at the beginning of each new segment, then restored, so that it can be repeated with an inversion. For example, when segment A begins, the value in the LFSR could be saved to a hold register. Once segment A is completed, the initial value of the LFSR at segment A may be restored to the LFSR from the hold register. A bit from the predefined bit position could then be sent out as part of the PRBS, inverted, and used to encode the next bit of the raw data stream. The LFSR may again cycle through 1,000 combinations of inverted segment $\overline{A}$, send a bit from each combination as part of the PRBS which could then be inverted and used to encode another 1K UI segment of raw data. Once inverted segment $\overline{A}$ is completed, segment B may begin. Advantageously, when idle-line detects (IDLEs) or large blocks of constant data are transmitted, this technique bounds the baseline wander, as shown in FIG. 1C.

Figure 1C:
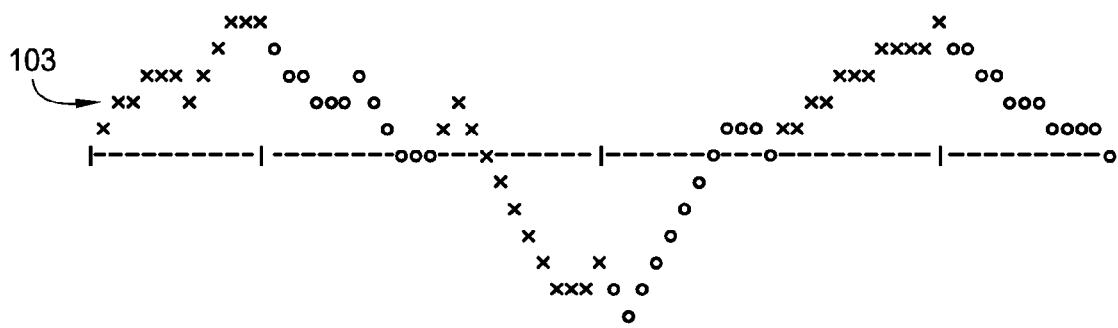

FIG. 1C is a schematic 103 illustrating a graphical result of the impact of implementing techniques to reduce disparity in high speed serial links, according to one embodiment disclosed herein. The schematic 103 is a graph capturing the baseline wander (or running disparity) of the encoded data stream. Each segment of the graph corresponds to the segments 121-126 of FIG. 1B, and indicates the baseline wander of the bit stream generated using the technique depicted in FIG. 1B. The "x" marks indicate the first sequence, such as sequence A, and the "o" marks indicate the inverted sequence, such as inverted sequence $\overline{A}$. As shown, by inverting the sequences, the baseline wander returns to zero after each inverted sequence is completed, i.e. after each 2K UI. For example, if the disparity of segment A is 50, indicating that the encoded data stream contains 50 more zeroes than ones, then the inverted sequence A would have 50 more ones than zero, and the running (total) disparity would be zero.

Figure 2:
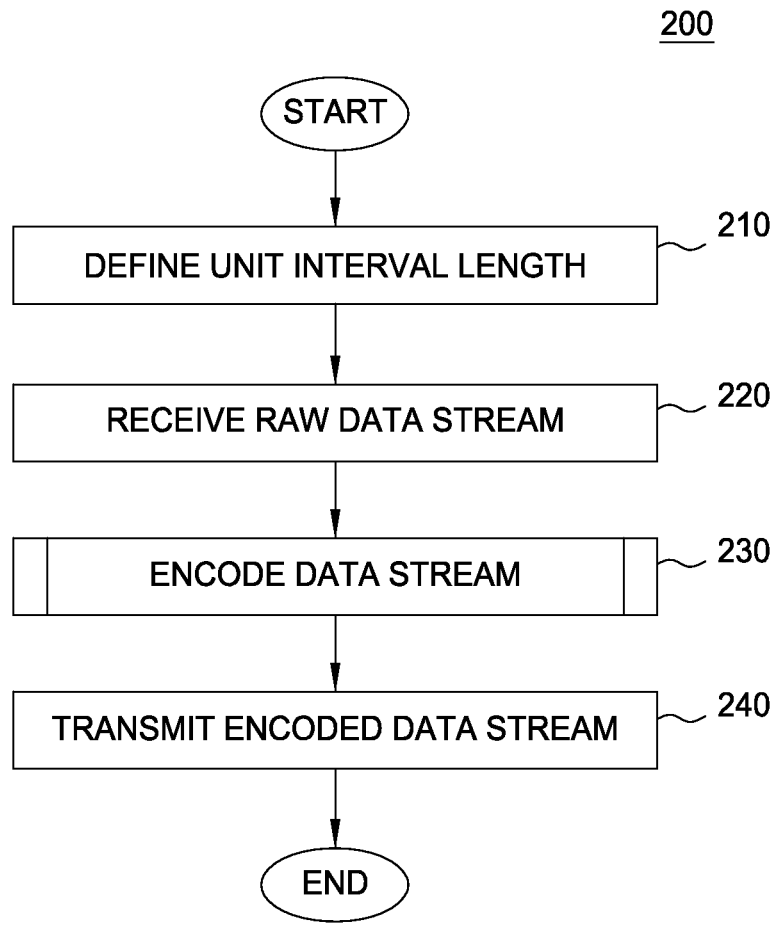
FIG. 2 is a flow chart illustrating a method to reduce disparity in high speed serial links, according to one embodiment disclosed herein.

FIG. 2 is a flow chart illustrating a method 200 to reduce disparity in high speed serial links, according to one embodiment disclosed herein. In some embodiments, the method 200 is executed by a designated component of a switch module of a distributed switch. At block 210, a segment length is defined. Although a segment length of 1000 bits (or unit intervals) was described above, the actual size can vary depending on the implementation. Generally speaking, the segment length should not be so small that the randomness of the data is compromised. Likewise, the segment length should not be too long, as the running disparity may also become too large during a given segment. At block 220, a raw data stream is received at the distributed switch. The raw data stream may comprise functional system data, or IDLE/fixed data. At block 230, described in greater detail with reference to FIG. 3, the data stream is encoded. At block 240, the encoded data stream is transmitted by the switch module to another switch module of the distributed switch.

Figure 3:
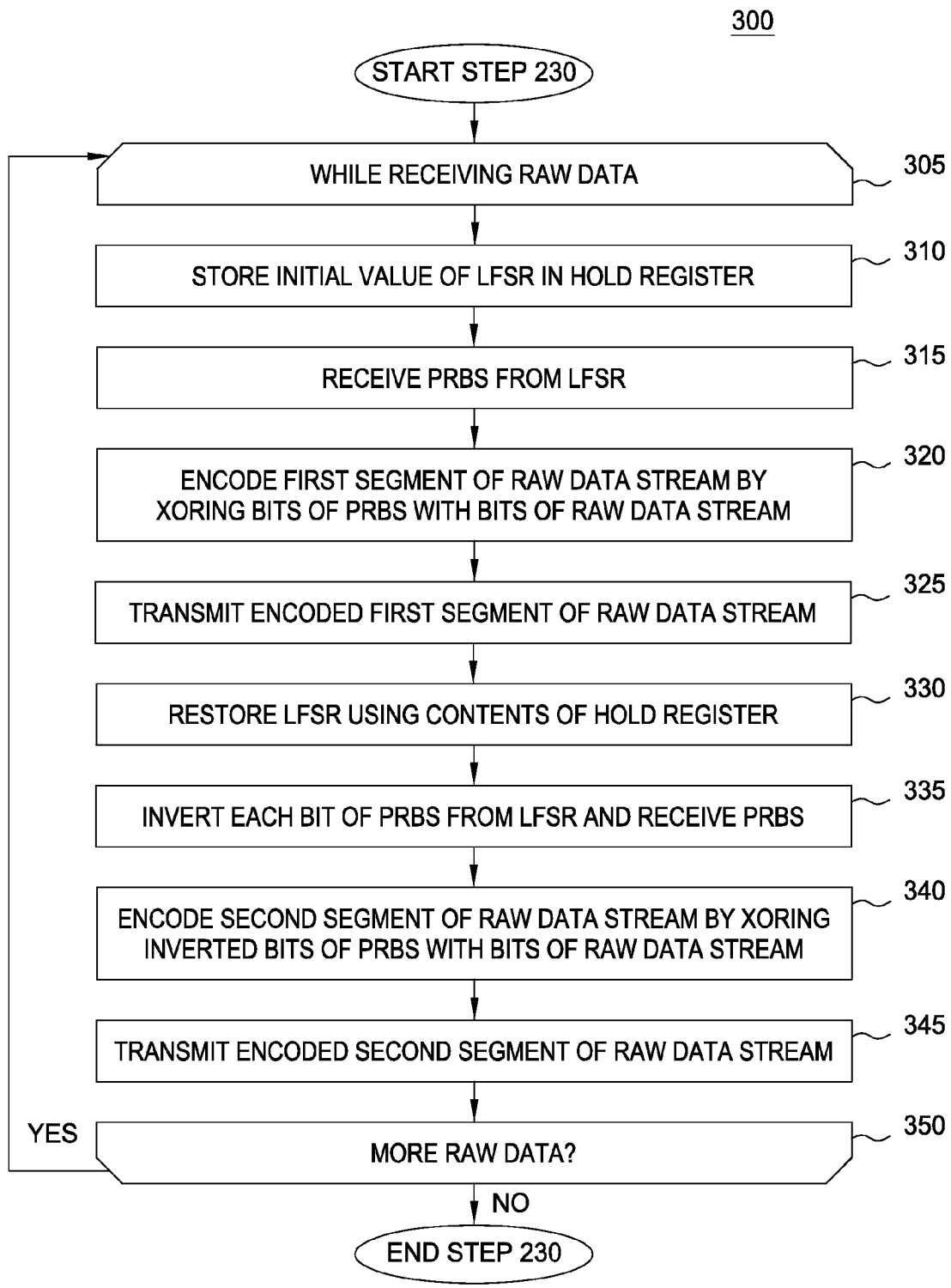
FIG. 3 is a flow chart illustrating a method to encode a data stream, according to one embodiment disclosed herein.

FIG. 3 is a flow chart illustrating a method 300 corresponding to block 230 to encode a data stream, according to one embodiment disclosed herein. The method 300 illustrates one technique to encode raw data using a PRBS sequence which is XORed with a first segment of raw data. The method 300 then inverts the PRBS sequence, which is XORed with a subsequent segment of raw data. At block 305, a loop including blocks 310-350 is executed while receiving raw data. At block 310, the initial value of the LFSR at the beginning of the segment is stored to a temporary hold register. For example, in embodiments where the LFSR is a 40-bit register, the first 40-bit value is stored in the hold register. At block 315, a pseudo-random bit stream (PRBS) is received from the LFSR. The PRBS may be comprised of bits which are selected from a predefined bit position of the LFSR during each cycle of the LFSR. In one embodiment, the least significant bit position is selected. At block 320, a first segment of the raw data stream is encoded by XORing the bits of the PRBS with the bits of the first segment of the raw data stream. At block 325, the encoded first segment of the raw data stream is transmitted to another switch module in the distributed switch.

At block 330, the LFSR is restored using the contents of the hold register. For example, a 40-bit value stored in the hold register may be copied to the LFSR, which corresponds to the initial value in the previous sequence. At block 335, bits from the selected bit position are transferred as the PRBS; however, after exiting the LFSR, the bits of the PRBS are inverted. At block 340, a second segment of the raw data stream is encoded by XORing the inverted bits of the PRBS with the bits of the second segment of the raw data stream. As described above, the first segment and the second segment sizes are defined by the predetermined segment length, and a corresponding number of bits are encoded. For example, where the segment length is 1,000 UI, the LFSR will generate 1,000 bits for the PRBS, which, in the first sequence, are used to encode the first segment of 1,000 bits of the raw data stream. For the second segment, the 1,000 bits will be inverted and used to encode the second segment of the raw data stream, which is also 1,000 bits long. At block 345, the encoded second segment of the raw data stream is transmitted to another switch module in the distributed switch.

Serial link protocols typically define a method for synchronizing a "transmit LFSR" code with a "receive LFSR" code. To incorporate embodiments disclosed herein, a given protocol may need to be modified to guarantee that the "receive LFSR" knows whether it should start with a "true" LFSR segment, or an "inverted" LFSR segment. Additionally, inversion logic may be placed between the LFSR and the XOR gate where the encoding is performed. The inversion logic, in one embodiment, may be an XOR gate which receives the PRBS from the LFSR as one input, and a control signal which indicates whether or not the PRBS should be inverted. For example, a "1" XORed with any value inverts the value. Therefore, a "1" would indicate when the bits would need to be inverted, and a "0" would pass the bits through without inversion.

Figure 4:
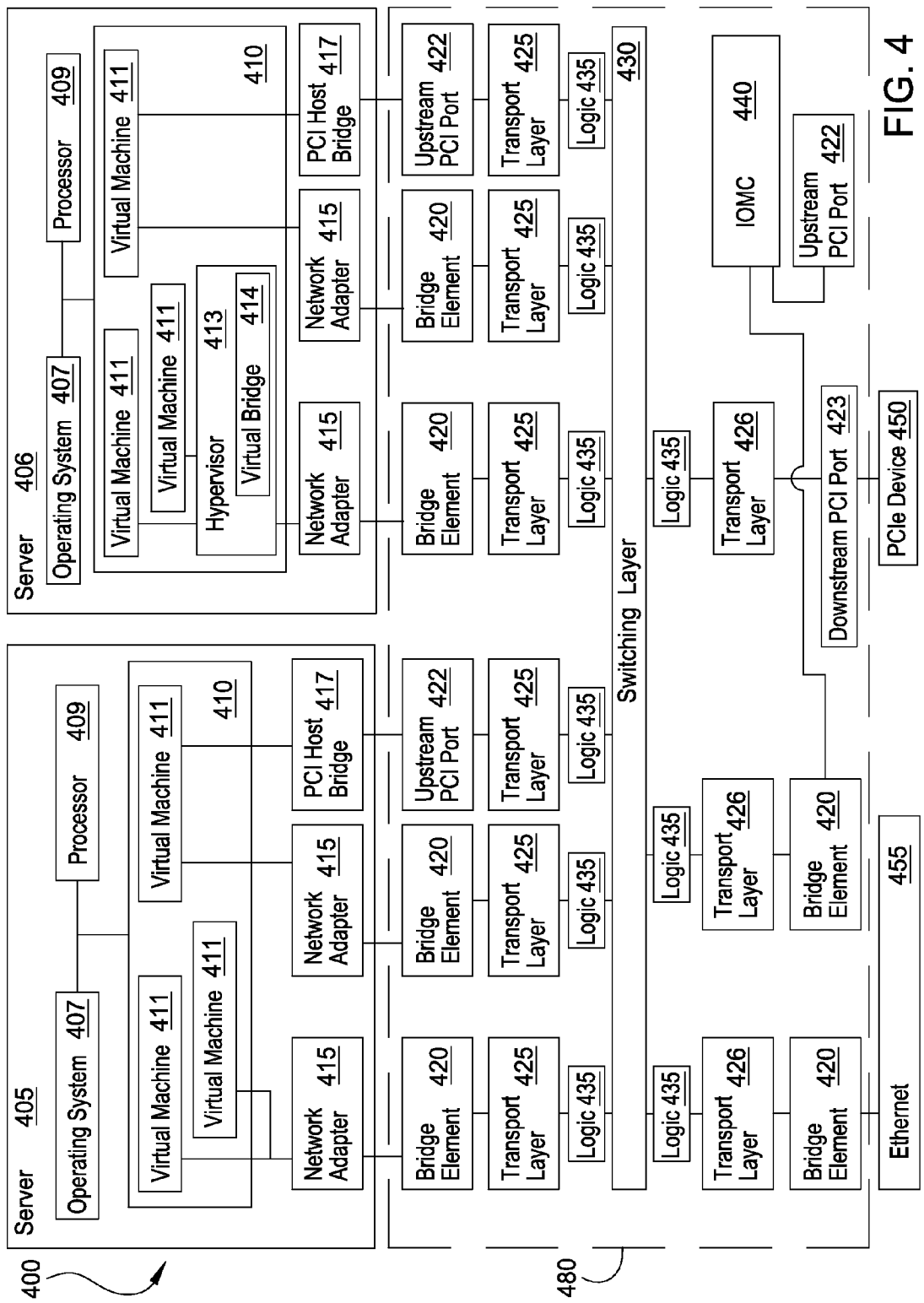
FIG. 4 illustrates a system architecture that includes a distributed, virtual switch, according to one embodiment described herein.

FIG. 4 illustrates a system architecture 400 that includes a distributed, virtual switch, according to one embodiment disclosed herein. The first server 405 may include at least one processor 409 coupled to a memory 410. The processor 409 may represent one or more processors (e.g., microprocessors) or multi-core processors. The memory 410 may represent random access memory (RAM) devices comprising the main storage of the server 405, as well as supplemental levels of memory, e.g., cache memories, non-volatile or backup memories (e.g., programmable or flash memories), read-only memories, and the like. In addition, the memory 410 may be considered to include memory storage physically located in the server 405 or on another computing device coupled to the server 405.

The server 405 may operate under the control of an operating system 407 and may execute various computer software applications, components, programs, objects, modules, and data structures, such as virtual machines 411.

The server 405 may include network adapters 415 (e.g., converged network adapters). A converged network adapter may include single root I/O virtualization (SR-IOV) adapters such as a Peripheral Component Interconnect Express (PCIe) adapter that supports Converged Enhanced Ethernet (CEE). Another embodiment of the system 400 may include a multi-root I/O virtualization (MR-IOV) adapter. The network adapters 415 may further be used to implement of Fiber Channel over Ethernet (FCoE) protocol, RDMA over Ethernet, Internet small computer system interface (iSCSI), and the like. In general, a network adapter 415 transfers data using an Ethernet or PCI based communication method and may be coupled to one or more of the virtual machines 411. Additionally, the adapters may facilitate shared access between the virtual machines 411. While the adapters 415 are shown as being included within the server 405, in other embodiments, the adapters may be physically distinct devices that are separate from the server 405.

In one embodiment, each network adapter 415 may include a converged adapter virtual bridge (not shown) that facilitates data transfer between the adapters 415 by coordinating access to the virtual machines 411. Each converged adapter virtual bridge may recognize data flowing within its domain (i.e., addressable space). A recognized domain address may be routed directly without transmitting the data outside of the domain of the particular converged adapter virtual bridge.

Each network adapter 415 may include one or more Ethernet ports that couple to one of the bridge elements 420. Additionally, to facilitate PCIe communication, the server may have a PCI Host Bridge 417. The PCI Host Bridge 417 would then connect to an upstream PCI port 422 on a switch element in the distributed switch 480. The data is then routed via the switching layer 430 to the correct downstream PCI port 423 which may be located on the same or different switch module as the upstream PCI port 422. The data may then be forwarded to the PCI device 450.

The bridge elements 420 may be configured to forward data frames throughout the distributed virtual switch 480. For example, a network adapter 415 and bridge element 420 may be connected using two 40 Gbit Ethernet connections or one 100 Gbit Ethernet connection. The bridge elements 420 forward the data frames received by the network adapter 415 to the switching layer 430. The bridge elements 420 may include a lookup table that stores address data used to forward the received data frames. For example, the bridge elements 420 may compare address data associated with a received data frame to the address data stored within the lookup table. Thus, the network adapters 415 do not need to know the network topology of the distributed switch 480.

The distributed virtual switch 480, in general, includes a plurality of bridge elements 420 that may be located on a plurality of a separate, though interconnected, hardware components. To the perspective of the network adapters 415, the switch 480 acts like one single switch even though the switch 480 may be composed of multiple switches that are physically located on different components. Distributing the switch 480 provides redundancy in case of failure.

Each of the bridge elements 420 may be connected to one or more transport layer modules 425 that translate received data frames to the protocol used by the switching layer 430. For example, the transport layer modules 425 may translate data received using either an Ethernet or PCI communication method to a generic data type (i.e., a cell) that is transmitted via the switching layer 430 (i.e., a cell fabric). Thus, the switch modules comprising the switch 480 are compatible with at least two different communication protocols—e.g., the Ethernet and PCIe communication standards. That is, at least one switch module has the necessary logic to transfer different types of data on the same switching layer 430.

As shown, each ingress and egress port of the switching layer 430 has an encoding logic 435, which is used to encode raw data streams. Although not shown, the encoding logic 435 includes an LFSR and a hold register, as well logic capable of performing the techniques described above. The encoding logic 435 uses the techniques described above to encode raw data streams, namely by encoding a first raw data segment using a first LFSR PRBS, then encoding a second segment of raw data using the inverted LFSR PRBS.

Although not shown in FIG. 4, in one embodiment, the switching layer 430 may comprise a local rack interconnect with dedicated connections which connect bridge elements 420 located within the same chassis and rack, as well as links for connecting to bridge elements 420 in other chassis and racks.

After routing the cells, the switching layer 430 may communicate with transport layer modules 426 that translate the cells back to data frames that correspond to their respective communication protocols. A portion of the bridge elements 420 may facilitate communication with an Ethernet network 455 which provides access to a LAN or WAN (e.g., the Internet). Moreover, PCI data may be routed to a downstream PCI port 423 that connects to a PCIe device 450. The PCIe device 450 may be a passive backplane interconnect, as an expansion card interface for add-in boards, or common storage that can be accessed by any of the servers connected to the switch 480.

Although "upstream" and "downstream" are used to describe the PCI ports, this is only used to illustrate one possible data flow. For example, the downstream PCI port 423 may in one embodiment transmit data from the connected to the PCIe device 450 to the upstream PCI port 422. Thus, the PCI ports 422, 423 may both transmit as well as receive data.

A second server 406 may include a processor 409 connected to an operating system 407 and memory 410 which includes one or more virtual machines 411 similar to those found in the first server 405. The memory 410 of server 406 also includes a hypervisor 413 with a virtual bridge 414. The hypervisor 413 manages data shared between different virtual machines 411. Specifically, the virtual bridge 414 allows direct communication between connected virtual machines 411 rather than requiring the virtual machines 411 to use the bridge elements 420 or switching layer 430 to transmit data to other virtual machines 411 communicatively coupled to the hypervisor 413.

An Input/Output Management Controller (IOMC) 440 (i.e., a special-purpose processor) is coupled to at least one bridge element 420 or upstream PCI port 422 which provides the IOMC 440 with access to the switching layer 430. One function of the IOMC 440 may be to receive commands from an administrator to configure the different hardware elements of the distributed virtual switch 480. In one embodiment, these commands may be received from a separate switching network from the switching layer 430.

Although one IOMC 440 is shown, the system 400 may include a plurality of IOMCs 440. In one embodiment, these IOMCs 440 may be arranged in a hierarchy such that one IOMC 440 is chosen as a master while the others are delegated as members (or slaves).

Figure 5:
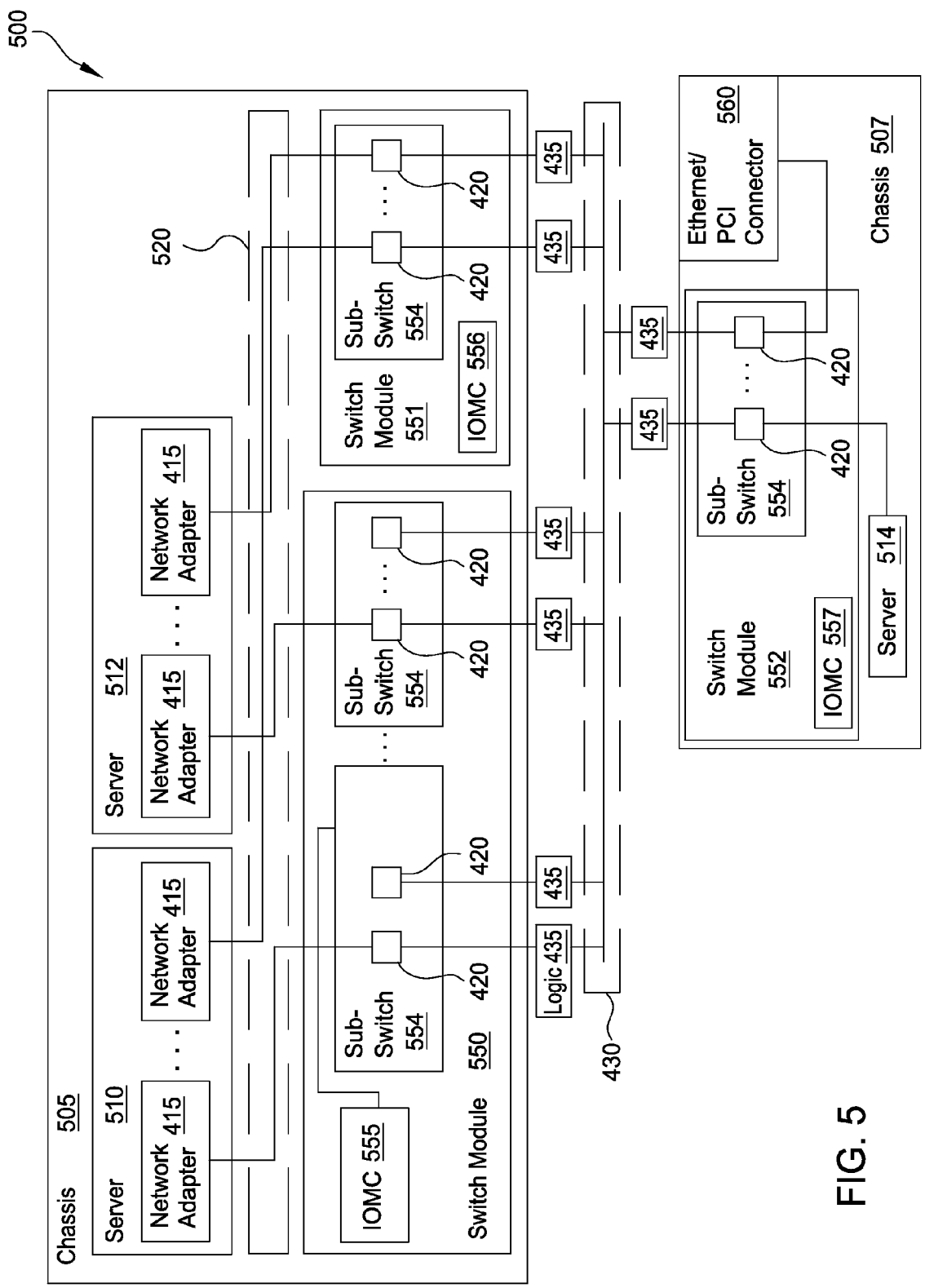
FIG. 5 illustrates the hardware representation of a system that implements a distributed, virtual switch, according to one embodiment described herein.

FIG. 5 illustrates the hardware representation of a system 500 that implements a distributed, virtual switch, according to one embodiment disclosed herein. Server 510 and 512 may be physically located in the same chassis 505; however, the chassis 505 may include any number of servers. The chassis 505 also includes a plurality of switch modules 550, 551 that include one or more sub-switches 554 (i.e., a microchip). In one embodiment, the switch modules 550, 551, 552 are hardware components (e.g., PCB boards, FPGA boards, etc.) that provide physical support and connectivity between the network adapters 415 and the bridge elements 420. In general, the switch modules 550, 551, 552 include hardware that connects different chassis 505, 507 and servers 510, 512, 514 in the system 500 and may be a single, replaceable part in the computing system.

The switch modules 550, 551, 552 (e.g., a chassis interconnect element) include one or more sub-switches 554 and an IOMC 555, 556, 557. The sub-switches 554 may include a logical or physical grouping of bridge elements 420—e.g., each sub-switch 554 may have five bridge elements 420. Each bridge element 420 may be physically connected to the servers 510, 512. For example, a bridge element 420 may route data sent using either Ethernet or PCI communication protocols to other bridge elements 420 attached to the switching layer 430 using the routing layer. However, in one embodiment, the bridge element 420 may not be needed to provide connectivity from the network adapter 415 to the switching layer 430 for PCI or PCIe communications.

Each switch module 550, 551, 552 includes an IOMC 555, 556, 557 for managing and configuring the different hardware resources in the system 500. In one embodiment, the respective IOMC for each switch module 550, 551, 552 may be responsible for configuring the hardware resources on the particular switch module. However, because the switch modules are interconnected using the switching layer 430, an IOMC on one switch module may manage hardware resources on a different switch module. As discussed above, the IOMCs 555, 556, 557 are attached to at least one sub-switch 554 (or bridge element 420) in each switch module 550, 551, 552 which enables each IOMC to route commands on the switching layer 430. For clarity, these connections for IOMCs 556 and 557 have been omitted. Moreover, switch modules 551, 552 may include multiple sub-switches 554.

The dotted line in chassis 505 defines the midplane 520 between the servers 510, 512 and the switch modules 550, 551. That is, the midplane 520 includes the data paths (e.g., conductive wires or traces) that transmit data between the network adapters 415 and the sub-switches 554.

Each bridge element 420 connects to the switching layer 430 via the routing layer. In addition, a bridge element 420 may also connect to a network adapter 415 or an uplink. As used herein, an uplink port of a bridge element 420 provides a service that expands the connectivity or capabilities of the system 500. As shown in chassis 507, one bridge element 420 includes a connection to an Ethernet or PCI connector 560. For Ethernet communication, the connector 560 may provide the system 500 with access to a LAN or WAN (e.g., the Internet). Alternatively, the port connector 560 may connect the system to a PCIe expansion slot—e.g., PCIe device 450. The device 450 may be additional storage or memory which each server 510, 512, 514 may access via the switching layer 430. Advantageously, the system 500 provides access to a switching layer 430 that has network devices that are compatible with at least two different communication methods.

As shown, a server 510, 512, 514 may have a plurality of network adapters 415. This provides redundancy if one of these adapters 415 fails. Additionally, each adapter 415 may be attached via the midplane 520 to a different switch module 550, 551, 552. As illustrated, one adapter of server 510 is communicatively coupled to a bridge element 420 located in switch module 550 while the other adapter is connected to a bridge element 420 in switch module 551. If one of the switch modules 550, 551 fails, the server 510 is still able to access the switching layer 430 via the other switching module. The failed switch module may then be replaced (e.g., hot-swapped) which causes the IOMCs 555, 556, 557 and bridge elements 420 to update the routing tables and lookup tables to include the hardware elements on the new switching module.

As shown, each ingress and egress port of the switching layer 430 contains an encoding logic 435 which encodes raw data using the techniques described above. The encoding logic 435 may contain, as described above, an LFSR, a hold register to store values generated by the LFSR, and logic capable of performing the above-described functionality.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. A computer-implemented method of encoding a bit stream to improve a running disparity of the encoded bit stream in a distributed network switch that includes a plurality of switch modules, comprising:
   receiving, at a first one of the plurality of switch modules, a raw data stream comprising a plurality of bits;
   receiving a bit sequence comprising a plurality of bits;
   encoding a first bit of the raw data stream using a corresponding first bit of the bit sequence;
   inverting the first bit of the bit sequence; and
   encoding a second bit of the raw data stream using the inverted first bit and by operation of one or more computer processors.

2. The method of claim 1, wherein encoding the first bit of the raw data stream comprises performing an exclusive or (XOR) between the first bit of the raw data stream and the first bit of the bit sequence, wherein encoding the second bit of the raw data stream comprises performing an XOR between the second bit of the raw data stream and the inverted first bit.

3. The method of claim 1, wherein the bit sequence is received from a linear feedback shift register (LFSR).

4. The method of claim 3, further comprising:
   prior to inverting the second bit of the bit sequence:
      storing the first bit of the bit sequence at a first location; and
      subsequent to encoding the first bit of the raw data stream:
         restoring the first bit of the bit sequence from the first location to the LFSR; and transmitting the restored first bit from the LFSR for inversion.

5. The method of claim 1, wherein the raw data stream comprises at least one of: (i) functional system data, (ii) idle-line detect data and (iii) fixed data.

6. The method of claim 1, wherein a predefined segment length is used to define a count of a number of bits of the raw data stream that are encoded using an equal number of bits from the bit sequence prior to inverting the first bit from the bit sequence to encode a next bit of the raw data stream.

7. The method of claim 1, further comprising transmitting the first encoded bit and the encoded second bit to a downstream switch module.

* * * * *